(12) United States Patent
Tuominen et al.

(10) Patent No.: US 8,984,746 B2
(45) Date of Patent: Mar. 24, 2015

(54) MANUFACTURE OF A CIRCUIT BOARD CONTAINING A COMPONENT

(75) Inventors: Risto Tuominen, Helsinki (FI); Petteri Palm, Regensburg (FI); Antti Lihola, Helsinki (FI)

(73) Assignee: GE Embedded Electronics Oy, Helsinki (FI)

(*) Notice: Subject to any disclaimer, the term of this patent is extended or adjusted under 35 U.S.C. 154(b) by 1333 days.

(21) Appl. No.: 12/293,412

(22) PCT Filed: Mar. 15, 2007

(86) PCT No.: PCT/FI2007/050141
§ 371 (c)(1),
(2), (4) Date: Sep. 17, 2008

(87) PCT Pub. No.: WO2007/107630
PCT Pub. Date: Sep. 27, 2007

(65) Prior Publication Data
US 2009/0133251 A1 May 28, 2009

(30) Foreign Application Priority Data

Mar. 17, 2006 (FI) ...................................... 20060256

(51) Int. Cl.
*H05K 3/02* (2006.01)
*H05K 3/10* (2006.01)
(Continued)

(52) U.S. Cl.
CPC ............... *H05K 1/185* (2013.01); *F02M 53/02* (2013.01); *F02M 53/06* (2013.01); *F02M 55/02* (2013.01);
(Continued)

(58) Field of Classification Search
CPC ..... F02M 53/02; F02M 55/02; F02M 55/025; F02M 69/465; F02M 53/06; H01L 21/56; H01L 21/568; H01L 23/3128; H01L 23/5389; H01L 24/19; H01L 24/97; H01L 25/50; H05K 1/185

USPC ........... 29/830–832, 834, 840, 841, 846–849; 174/255, 256, 260, 264; 361/761, 762; 438/112, 127; 257/701
See application file for complete search history.

(56) References Cited

U.S. PATENT DOCUMENTS 3,791,858 A * 2/1974 McPherson et al. .......... 174/264
4,478,331 A 10/1984 Ruin
(Continued)

FOREIGN PATENT DOCUMENTS

FR 2809533 A1 11/2001
WO WO-2004/077902 A1 9/2004
(Continued)

OTHER PUBLICATIONS

Megumu Takeuchi et al., "A Technology for High Density Mounting Utilizing Polymeric Multilayer Substrate,"Proceedings of the International Electronic Manufacuring Technology Symposium, Apr. 26, 1989, pp. 136-140, vol.-Symp. 6, IEEE, New York, US.

*Primary Examiner* — Donghai D Nguyen
(74) *Attorney, Agent, or Firm* — Seppo Laine Oy; Joshua P. Wert; Matthew A. Swanson

(57) ABSTRACT

A method for the manufacture of a circuit board containing a component and circuit board containing a component. The invention is based on first manufacturing an intermediate product, which contains the insulator layer of the circuit board and the components, which are set in place inside the insulator layer in such a way that the contact elements of the components face the surface of the intermediate product. After this, the intermediate product is transferred to the circuit-board manufacturing line, on which a suitable number of conductor-pattern layers and, if necessary, insulator layers are manufactured on one or both sides of the intermediate product, in such a way that, when manufacturing the first conductor-pattern layer, the conductor material forms an electrical contact with the contact elements of the components. Alternatively, stages can also be performed on a single manufacturing line.

8 Claims, 6 Drawing Sheets

(51) Int. Cl.
*H05K 1/18* (2006.01)
*F02M 53/02* (2006.01)
*F02M 53/06* (2006.01)
*F02M 55/02* (2006.01)
*F02M 69/46* (2006.01)
*H01L 21/56* (2006.01)
*H01L 23/31* (2006.01)
*H01L 23/538* (2006.01)
*H01L 23/00* (2006.01)
*H01L 25/00* (2006.01)
*H01L 25/065* (2006.01)
*H05K 3/18* (2006.01)

(52) U.S. Cl.
CPC ........... *F02M 55/025* (2013.01); *F02M 69/465* (2013.01); *H01L 21/56* (2013.01); *H01L 21/568* (2013.01); *H01L 23/3128* (2013.01); *H01L 23/5389* (2013.01); *H01L 24/19* (2013.01); *H01L 24/97* (2013.01); *H01L 25/50* (2013.01); *H01L 25/0655* (2013.01); *H01L 2224/16* (2013.01); *H01L 2924/01013* (2013.01); *H01L 2924/01027* (2013.01); *H01L 2924/01029* (2013.01); *H01L 2924/01033* (2013.01); *H01L 2924/01047* (2013.01); *H01L 2924/01082* (2013.01); *H01L 2924/14* (2013.01); *H01L 2924/1433* (2013.01); *H05K 3/108* (2013.01); *H05K 3/181* (2013.01); *H05K 2203/0156* (2013.01); *H05K 2203/1469* (2013.01); *H01L 2924/01005* (2013.01); *H01L 2924/01006* (2013.01); *H01L 2924/12041* (2013.01)
USPC ............ 29/846; 29/830; 29/841; 174/260; 438/112

(56) References Cited

U.S. PATENT DOCUMENTS

| | | | |
|---|---|---|---|
| 4,894,115 | A | 1/1990 | Eichelberger et al. |
| 5,042,145 | A | 8/1991 | Boucquet |
| 5,248,852 | A | 9/1993 | Kumagai |
| 5,355,102 | A | 10/1994 | Kornrumpf et al. |
| 5,497,033 | A | 3/1996 | Fillion et al. |
| 6,038,133 | A | 3/2000 | Nakatani et al. |
| 6,271,469 | B1 | 8/2001 | Ma et al. |
| 6,489,685 | B2 | 12/2002 | Asahi et al. |
| 6,512,182 | B2 * | 1/2003 | Takeuchi et al. .......... 29/846 |
| 7,002,245 | B2 * | 2/2006 | Huang et al. .......... 257/701 |
| 7,202,107 | B2 * | 4/2007 | Fuergut et al. .......... 438/112 |
| 2002/0117743 | A1 | 8/2002 | Nakatani et al. |
| 2004/0245608 | A1 | 12/2004 | Huang et al. |
| 2005/0001331 | A1 | 1/2005 | Kojima et al. |

FOREIGN PATENT DOCUMENTS

| | | |
|---|---|---|
| WO | WO-2004/077903 A1 | 9/2004 |
| WO | WO-2005/020651 A1 | 3/2005 |
| WO | WO-2005/125298 A2 | 12/2005 |
| WO | WO-2004/089048 A1 | 10/2008 |

* cited by examiner

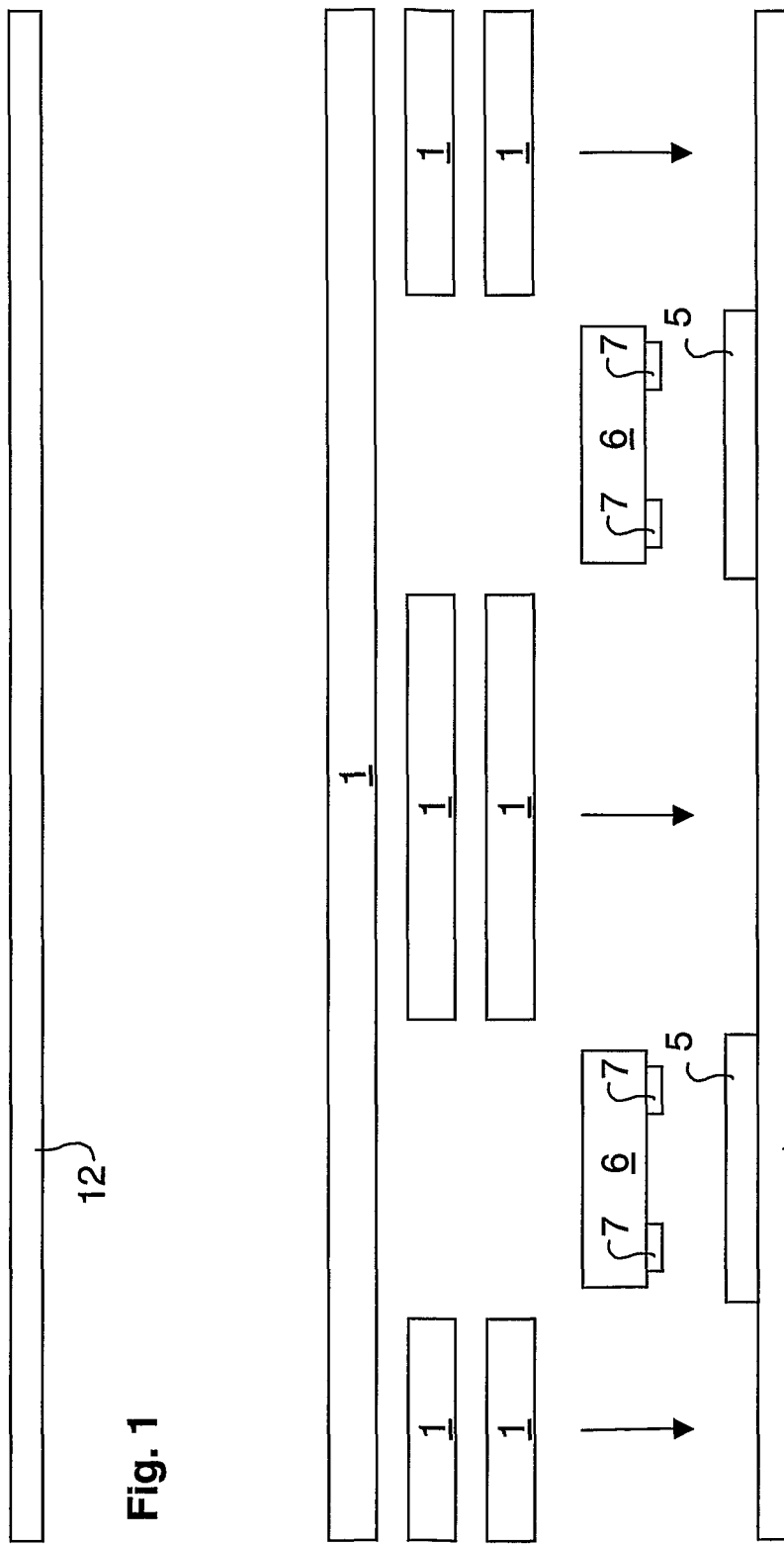

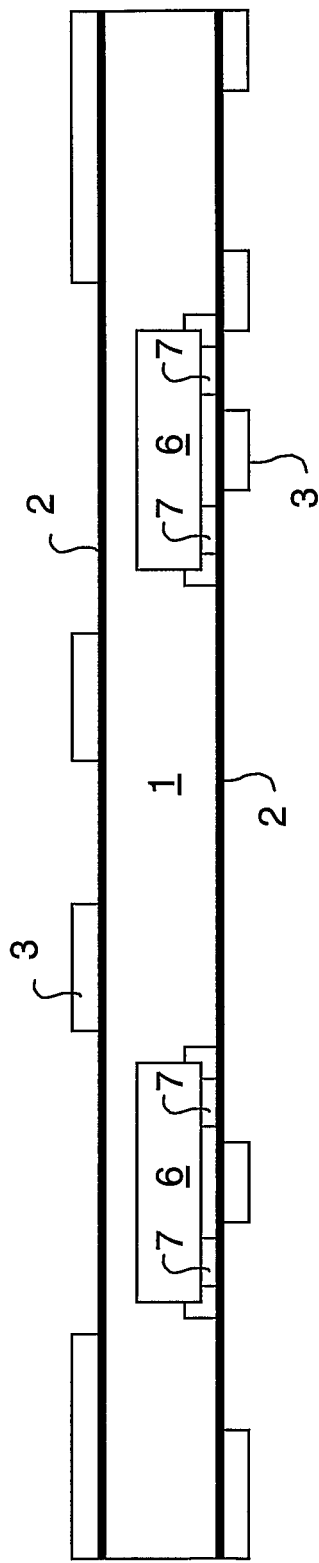
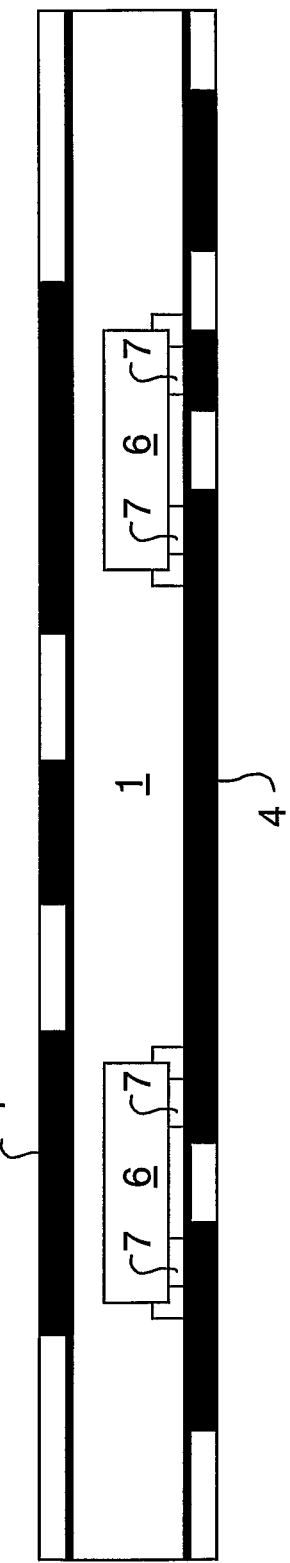
Fig. 6
Fig. 7

MANUFACTURE OF A CIRCUIT BOARD CONTAINING A COMPONENT

BACKGROUND OF THE INVENTION

1. Field of the Invention

The present invention relates to a method for manufacturing a circuit board containing a component, as well as to a circuit board containing a component.

2. Brief Description of the Related Art

Layers containing a component are manufactured, for example, when manufacturing multi-layer circuit boards or other corresponding electronic modules. In particular, the invention relates to a method for manufacturing a layer, which contains one or several components, which are connected electrically to an external circuit, or to each other, with the aid of conductor structures manufactured in the electronic module.

US Publication No. 2005/0001331 discloses a manufacturing method for circuit-board structure, in which first of all a circuit board, which comprises an insulator layer and a conductor pattern on the surface of it, is manufactured. After that, a semiconductor component is then connected to the conductor pattern of the surface of the circuit board, using a suitable flip-chip attachment method. The connection is made with the aid of contact bumps on the surface of the semiconductor component. In the method of the US publication, after attachment of the component, a patterned and unpatterned insulating-material layer is laminated on top of the circuit board and then on their surface a conductor-pattern layer.

U.S. Pat. Nos. 6,038,133 and 6,489,685, as well as US Publication No. 2002/0117743 disclose methods, in which a conductor pattern is made on the surface of a detachable membrane and a semiconductor component is attached to the conductor pattern using a flip-chip attachment method. After this, the component is surrounded with a layer of insulating material and the detachable membrane is removed.

The aforementioned U.S. Pat. No. 6,038,133 and US Publication No. 2002/0117743 also disclose a method, in which a flip-chip method is used to attach the component not to a conductor pattern, but to a unified conductor membrane, from which conductor patterns are formed in a later stage of the process. A corresponding method is also disclosed in, for example, U.S. Pat. No. 5,042,145, WO 2004/077902, WO 2004/077903, and WO 2005/020651.

In addition to the types of method referred to above, many other methods are known, by means of which circuit-board structures containing components can be manufactured. For example, the components can be first of all placed inside an insulating-material layer and connected electrically to the conductor layer only after this, as is disclosed in International Publication No. WO 2004/089048. In the method of WO 2004/089048, the component is glued onto the surface of the conductor layer and after the component has been glued an insulating-material layer is formed on, or attached to the surface of the conductor layer. After the gluing of the component, vias are also made, through which electrical contacts can be formed between the conductor layer and the component. After this, conductor patterns are formed from the conductor layer, to the surface of which the component has been glued. With the aid of the method described by the publication, it is possible to manufacture mechanically durable electronic modules, which contain embedded unpacked components. A good side of the method is also the fact that the contacts to the components can be made by growing metal, in which case the electrical properties of the contacts will be excellent.

However, the method disclosed in WO 2004/089048 differs from the conventional circuit-board manufacturing process to such an extent that its introduction to mass production will in most cases require the construction of a new manufacturing line, or at least alterations to a traditional manufacturing line. Thus the introduction of the method will also demand considerable initial investments.

The invention is intended to improve the method disclosed in WO 2004/089048, so that it can be exploited more easily also in connection with traditional circuit-board manufacturing processes.

The invention is based on first of all manufacturing an intermediate product, which contains the insulator layer of the circuit board and the components, which are attached in place inside the insulator layer, in such a way that the contact elements of the components open onto the surface of the intermediate product, or at least extend into the vicinity of the surface of the intermediate product. After this, the intermediate product is transferred to a circuit-board manufacturing line, on which a suitable number of conductor-pattern layers, and if necessary insulator layers are made on one or both sides of the intermediate product, in such a way that in the manufacture of the first conductor-pattern layer the conductor material forms an electrical contact with the contact elements of the components.

At the same time, according to the invention an alternative method is also created for manufacturing the product described in WO 2004/089048.

Considerable advantages are gained with the aid of the invention.

With the aid according to the invention, the method disclosed in WO 2004/089048 can be more easily utilized also in connection with traditional circuit-board manufacturing processes.

With the aid of the invention, an alternative method is also presented for manufacturing the product described in WO 2004/089048.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention.

FIG. 1 shows the support membrane being used as the initial material for manufacturing a circuit-board layer, as well as an intermediate stage according to one embodiment, in which a local layer of adhesive has been added on top of the support membrane of the figure.

FIG. 2 shows an intermediate stage according to one embodiment, in which components are attached on top of the support membrane of FIG. 1, and an insulator layer is made.

FIG. 6 shows the piece of FIG. 5, after a patterned resist layer has been made on the surface of the piece.

FIG. 7 shows the piece of FIG. 6, after conductor patterns have been made in the openings in the resist layer.

DETAILED DESCRIPTION OF THE PREFERRED EMBODIMENTS

Figure 3:
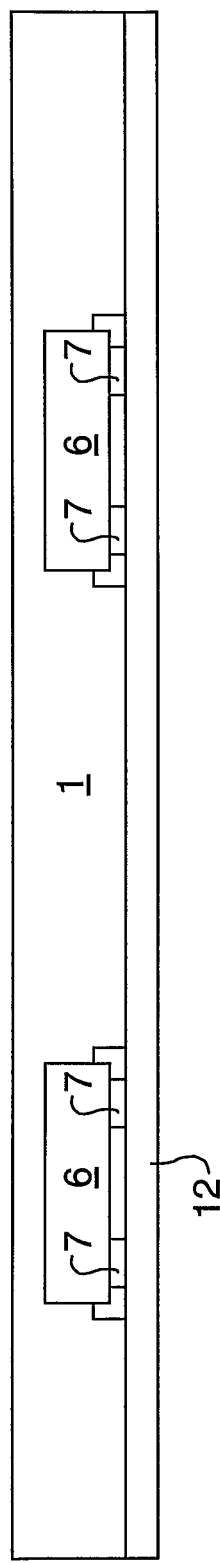
FIG. 3 shows an intermediate stage according to one embodiment, after the operations shown in FIG. 2. The figure also shows one possible intermediate product.

In the methods according to the embodiments, manufacture starts from a support membrane 12, which can be, for example, a bare metal layer (FIG. 1). One suitable manufacturing material for the support membrane 12 is a copper film (Cu). The support membrane 12 can also be, for example, of aluminium (Al), steel, or some insulating material, such as a polymer. The support membrane 12 can also be a coated metal membrane, or some other membrane containing several layers, or several materials.

Manufacture can also be started from a support membrane 12, on the first side of which is an insulating-material layer 1 (not shown in the figures). In that case, the first surface is the surface on the side to which the component, which is embedded inside the insulator layer 1, is attached. Holes or recesses for the embedded components are then manufactured in the insulating-material layer 1. The recesses can be made either before the insulating-material layer 1 and the support membrane 12 are attached to each other, or after they are attached. Some machining method known in the circuit-board industry, for example, milling or laser drilling can be used to make a recess. Corresponding methods can also be used to make alignment openings or other alignment markings in the support membrane 12.

In the embodiments shown in the figures, the components 6 are attached to the surface of the support membrane 12 with the aid of an adhesive (FIG. 2). For gluing, a layer of adhesive 5 is spread on the attachment surface of the support membrane 12, or the attachment surface of the component 6, or on both attachment surfaces. After this, the components 6 can be aligned with the planned positions for the components 6, for example with the aid of alignment marks.

In an alternative embodiment, a support membrane 12 is used, which has in itself a sufficient adhesive property that an adhesive is not required. In that case, the components 6 are pressed directly against the support membrane 12, in such a way that the components adhere in a corresponding manner sufficiently in place, as described in connection with the embodiment using adhesive. Such a support membrane 12 can, for example, include a tape-like surfacing or consist of a polymer or corresponding material at least the surface part of which is plastic.

The method can also be implemented without the use of an adhesive 5, or an adhesive property. In that case, the components 6 can be attached in place with the aid of a vacuum, for example. The vacuum or corresponding temporary attachment can then be maintained until the component 6 is sufficiently attached with the aid of the insulator material 1. One further alternative is to attach the components 6 with the aid of a suitable mechanical attachment.

One embodiment using a vacuum is a vacuum table, the surface of which also acts as a support membrane 12, or really as a support surface that replaces the support membrane 12. In that case, the components 6 are attached with the aid of the vacuum to the support surface, i.e. to the vacuum table and an insulating-material layer 1 is made on the surface of the table around the components 6. After this, the intermediate product formed by the insulating-material layer 1 and the components 6 is lifted off the surface of the vacuum table, in other words the support surface is removed and the contact elements 7 facing towards the support surface are revealed. When using a support surface, the insulator material can also be made, for example, by injection moulding.

The component 6 to be attached can be, for example, an integrated circuit, such as a memory chip, processor, or ASIC. The component to be attached can also be, for example, a MEMS, LED, or passive component. The component to be attached can be packaged or unpackaged, and its contact elements 7 can consist of contact areas, contact bumps, or similar. On the surface of the contact areas of the component, there can also be a conductor coating that is thinner than a contact bump. The outer surface of the contact elements 7 of the component, which in the present document is referred to as the free contact surface of the contact element, can thus be on the level of the outer surface of the component, on the bottom of the recesses in the surface of the component, or on the surface of protrusions from the surface of the component. For reasons of clarity, it should be further stated that the contact elements 7 have a first contact surface, which is in electrical contact with the semiconductor material of the component or with an internal conductor, as well as contact surface opposite to this, which is referred to as the free contact surface and which is intended for connecting an external electrical circuit to operate jointly with an internal electrical functionality of the component.

The term attachment surface of the component 6 refers to that surface of the component 6 that faces the support membrane 12. The attachment surface of the component 6 comprises contact elements 7, by means of which an electrical contact can be created to the component. The contact elements can be, for example, flat areas on the surface of the component 6, contact areas, or more usually contact protrusions, such as contact bumps protruding from the surface of the component 6. There are generally at least two contact elements in the component 6. In complex microcircuits, there can be very many contact elements. The component 6 can comprise contact elements on other surfaces too than on the attachment surface, for example, on the opposite surface (rear surface) to the attachment surface, or on the sides between them (side surfaces).

It is generally preferably to spread so much adhesive on the attachment surface or attachment surfaces that the adhesive entirely fills the space remaining between the components 6 and the support membrane 12. The unified adhesive layer will then protect the component in the direction of the attachment surface.

The term adhesive refers to a material, by means of which the components can be attached to the support membrane. One property of an adhesive is that the adhesive can be spread on the surface of the support membrane and/or the component in a liquid form, or otherwise in a form that conforms to the surface shapes, for example in the form of a membrane. A second property of the adhesive is that after being spread, the adhesive hardens, or can be hardened at least partly, in such a way that the adhesive is able to hold the component in place (relative to the support membrane) for at least as long as it takes for the component to be attached to the structure in some other way. A third property of the adhesive is its adhesive ability, i.e. its ability to adhere to the surface being glued.

The term gluing refers to attaching the component and the support membrane to each other with the aid of an adhesive. Thus in gluing an adhesive is brought between the component and the support membrane and the component is placed in a suitable position relative to the support membrane, in which the adhesive is in contact with the component and the support membrane and at least partly fills the space between the component and the support membrane. After this, the adhesive is allowed to harden (at least partly) or the adhesive is actively cured (at least partly), so that the component becomes attached to the support membrane with the aid of the adhesive. In some embodiments, the contact elements of the component may protrude through the adhesive layer during gluing to come into contact with the support layer, or press partly into the support layer.

The adhesive used in the embodiments is, for example, a filled or unfilled thermosetting epoxy. The adhesive is selected in such a way that the adhesive used has sufficient adhesion with the support layer and the component. One preferred property of the adhesive is a suitable coefficient of thermal expansion, so that the thermal expansion of the adhesive will not differ too greatly from the thermal expansion of the surrounding material during the process. The adhesive selected should also preferably have a short hardening time, preferably of at most a few seconds. Within this time the adhesive should harden at least partly, in such a way that the adhesive will be able to hold the component in place. The final hardening can take clearly longer and the final hardening can, in fact, be planned to take place in connection with later process stages. The adhesive should also withstand the process temperatures used, for example, heating to a temperature of 100-265° C. a few times, as well as other stresses of the manufacturing process, for example, chemical or mechanical stress. The electrical conductivity of the adhesive is preferably of the same order as the electrical conductivity of the insulating material.

A suitable insulating-material layer 1 is selected as the base material of the electronic module, for example, a circuit board. The insulating-material layer 1 can be manufactured from a suitable polymer, or from a material containing a polymer. The manufacturing material of the insulating-material layer 1 can be, for example, in a liquid or pre-cured form (such a prepreg). A glass-fibre reinforced epoxy sheet, such as a FR4 or FR5-type sheet, for example, can be used in the manufacture of the insulating-material layer 1. Other examples of materials that can be used in the manufacture of the insulating-material layer 1 are PI (polyimide), aramid, polytetrafluoroethylene, and Teflon®. Instead of, or along with thermosetting plastics, thermoplastics can also be utilized in the manufacture of the insulating-material layer 1, for example, some suitable LCP (liquid crystal polymer) material.

Recesses or vias (FIG. 2) selected according to the size and mutual positions of the components 6 glued to the support membrane 12 can be made in the insulating-material layer 1 using a suitable method. The recesses or vias can also be manufactured to be slightly larger than the components 6, in which case the alignment of the insulating-material layer 1 relative to the support membrane 12 will not be so critical. If the process uses an insulating-material layer 1, in which vias are made for components 6, certain advantages can be achieved by using in addition a separate insulating-material layer 1, in which holes are not made (the topmost layer in FIG. 2). Such an insulating-material layer 1 can be located on top of the perforated insulating-material layers 1, to cover the vias manufactured for the components.

After this the insulator-material is cured, when an essentially unified insulating-material layer 1 (FIG. 3) with be formed, both in embodiments using a single insulating-material layer 1 and in those using several insulating-material layers 1. At the same time it is possible to laminate a membrane corresponding to the support membrane 12, also on the other surface of the insulator layer 1, in which case the intermediate product obtained will be in equilibrium in terms of mechanical stresses.

At this stage in the method, an intermediate product will have been achieved, which can be transferred to another manufacturing line for the growing of conventional circuit-board layers. The intermediate product can also be packed in a delivery package for delivery to a separate factory for continuation of the circuit-board manufacture. Such a delivery package 11 (FIG. 11C) typically comprises several boards as intermediate products packed in a wrapping containing plastic and/or paper products and/or in a box, in such a way that the intermediate products can be moved for the required distance without damage. This transfer distance can be, for example, to another factory in the same industrial area, or even from one country or continent to another.

One important property of the intermediate product is that the components 6 are at least substantially inside the insulator material. Two important examples of cases, in which the component 6 is at least substantially inside the insulator material are the following:

The component 6 is entirely inside the insulator material. In that case, there is insulator material on the attachment surface, rear surface, and side surfaces of the component 6.

The component 6 is surrounded by the insulator material. In that case, there is insulator material on the side surfaces of the component 6, but the attachment surface of the component is essentially free of insulator material. Also the rear surface of the component is typically covered with insulator material, but it is also possible for the rear surface of the component to be essentially free of insulator material.

Another important property of the intermediate product is that the free contact surfaces of the component 6 are essentially close to the level of the outer surface of the intermediate product. If the intermediate product comprises a protective membrane (for example, a support membrane 12) that is intended to be removed and can be easily removed, the free contact surfaces of the components 6 should be essentially close to the level of the outer surface of the intermediate product, at least after the protective membrane has been removed. In this connection, essentially close means that the level of the free contact surface differs from the level of the outer surface of the intermediate product generally by at most 40 micrometres and preferably by at most 20 micrometres. In more demanding applications, the intent is for the level of the contact surface to differ from the level of the outer surface of the intermediate product by at most 5 micrometres. The direction of this deviation can be outwards or inwards from the surface of the intermediate product, i.e. in a preferred embodiment the height level of the free contact surface is between +5 . . . −5 micrometres from the level of the surface of the intermediate product.

If the component, or at least its free contact surface is close to the level of the surface of the intermediate product, the contact surface can be easily cleaned using a suitable method, if cleaning is necessary. This will create a readiness for making a good electrical contact. The term cleaning refers to the removal of possible insulating material and/or impurities. Some possible cleaning methods that can be referred to are chemical cleaning, plasma cleaning, UV cleaning, and laser cleaning. Of course, other suitable methods can be used.

A third important property of the intermediate product is that the components are accurately positioned relative to each other, at least to the extent of a single end-product module. The term end-product module then refers to that part of the intermediate product, which becomes one part of the electronic device that is the final product.

The intermediate product can thus contain several end-product modules, which in some later stage of the manufacturing process are separated from each other to form parts of an end product or end products. The end-product modules can be grouped in the intermediate product into delivery blanks, which typically comprise 1-25 end-product modules. An entire production panel can, in turn, comprise, for example, 1-20 delivery blanks. The accurate mutual alignment of the components is preferably also implemented inside the delivery blank, the goal being to achieve good alignment accuracy to the extent of the entire production panel too.

Figure 4:
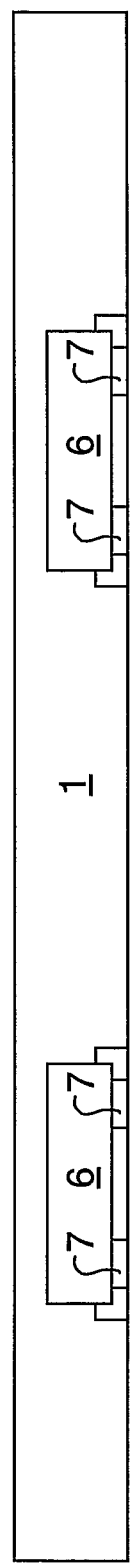
FIG. 4 shows the piece of FIG. 3, after the removal of the support membrane. The figure also shows a second possible intermediate product.

When the circuit-board manufacture continues, the support membrane 12 (and if necessary the corresponding membrane on the surface opposite to the insulator layer 1) is removed and the contact elements 7 of the component 6 are revealed (FIG. 4). This stage can also be performed before taking the intermediate product, in which case no substantial amount of the material of the support membrane 12 will remain in the intermediate product and the contact elements 7 are thus preferably revealed, so that an electrical contact can be formed to them by growing conductor material on the surface or adding it to the surface. In addition, it should be noted that the method can also be performed on a single manufacturing line, in which case the intermediate product is not taken from the line to be delivered to another manufacturing line.

After the insulating-material layer has hardened sufficiently, the holes required for vias (not shown in the figures) can be manufactured in the blank. An electrical connection between the conductor structures on the opposite sides of the insulator layer 1 can be formed later through such vias. The making of the holes can take place before or after the aforementioned intermediate-product stages.

Irrespective of the stage at which the intermediate product is taken (or whether manufacture is continued directly on the same line), a conductor-pattern layer 4 can be made on the surface of the insulator layer 1, so that it forms electrical contacts with selected contact elements 7. In a corresponding manner and at a corresponding stage a conductor-pattern layer can also be manufactured on the opposite surface of the insulator layer.

The manufacture of the conductor-pattern layer can be performed in several different ways. According to one embodiment, the conductor layer is manufactured by using a growing method to grow on top of a conductor membrane. In that case, the conductor membrane is grown directly in its correct shape According to a second embodiment, the conductor-pattern layer is manufactured using a printing method, for example, from a conductive paste. According to a third embodiment, a unified conductor layer is made on the surfaces of the intermediate product, from which in turn conductor patterns are made by removing areas of the material of the conductor layer. The areas can be removed, for example, using a photolithography method, or a laser-ablation method. In a fourth embodiment, the conductor-pattern layer is manufactured by outputting or printing, utilizing a conductive ink (e.g., metal ink), which typically contains conductive metal and/or carbon particles. In a fifth embodiment, the conductor-pattern layer is manufactured by outputting or printing, utilizing a conductive polymer. The outputting technique used can be, for example, a suitable selective dosing technique, such as the inkjet technique, or the additive writing technique. The conductor-pattern layer can also be manufactured using some other method that traces or produces electrical conductors.

Figure 5:
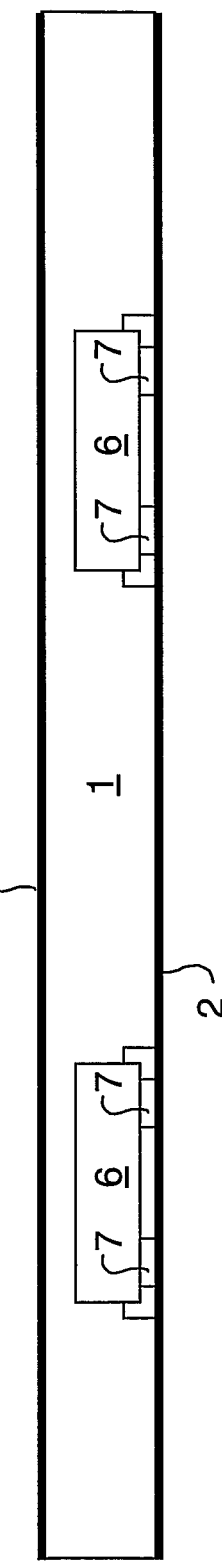
FIG. 5 shows the piece of FIG. 4, after manufacture of the seed layer.

Before the manufacture of the conductor pattern, the surface or surfaces of the insulator layer 1 can be treated, in order to improve the adhesion of the conductor layer. The treatment can be performed, for example, between the stages shown in FIGS. 4 and 5, by treating the surface of the insulator layer 1 in such a way as to improve the adhesion of the seed metal of the conductor layer on the surface of the insulator layer 1. Thanks to the improved adhesion, narrower conductor structures can be made in the module, and a denser network of conductors achieved. The surface treatment can be performed, for example, chemically, by plasma, with the aid of UV radiation, or by laser.

In general, it is not, however, necessary to manufacture a conductor pattern on the surface of the intermediate product shown in FIG. 4, but instead it is possible to continue from this stage using any method whatever, with the aid of which it is possible to create the necessary electrical contacts to the components 6. One alternative is to attach another intermediate product to the surface of the intermediate product, when the intermediate products are aligned relative to each other and pressed and attached against each other. In that case, contact structures, with the aid of which a good electrical contact can be ensured, can if necessary be prefabricated on the free contact surfaces of the components contained in either or both of the intermediate products. It is also possible to press only a prefabricated conductor structure against the surface of the intermediate product. It is also possible to continue from the intermediate product with the aid of wire bonding, or some other known method.

In the embodiment shown in the figures, the procedure is thus to grow a thin seed layer 2 of metal (FIG. 5) on both surfaces of the insulating-material layer 1. The seed layer 2 can be, for example, of chemically grown copper. If holes have been made in the insulating-material layer 1 for vias, the seed layer 2 will also grow on the inner surfaces of the holes. After this, manufacture is continued by spreading resist layers 3, typically photo-resist layers, on the surfaces of the seed layers 2. In more precise embodiments, it is also possible to use a lithography technique based on the use of electromagnetic radiation of shorter wavelength, or for example an electron beam lithography technique. In the case of a photo resist, the resist layers 3 are exposed through a patterned mask and after this the blank is developed. After developing, the exposed resist layers 3 will be patterned as desired to form conductor-pattern masks (FIG. 6). A corresponding result can also be achieved using alternative lithography techniques.

In the example of the figure, manufacture is continued by growing a conductor material, typically copper, electrolytically in the areas from which the photo resist 3 was removed. The desired conductor patterns 4 (FIG. 7) are then formed on the surfaces of the seed layers 2. The thickness of the conductor pattern 4 can be, for example, 20 micrometers while the line width of the conductor patterns being manufactured can also be less than 20 micrometers. Thus the method can also be used to make small and precise conductor patterns.

The method can be modified in such a way that a layer of a second metal or metal allow, for example tin, is manufactured on the surface of the conductor patterns 4 or on the interface between the seed layers 2 and the conductor patterns 4. This layer can be used as an etching stopper.

Figure 8:
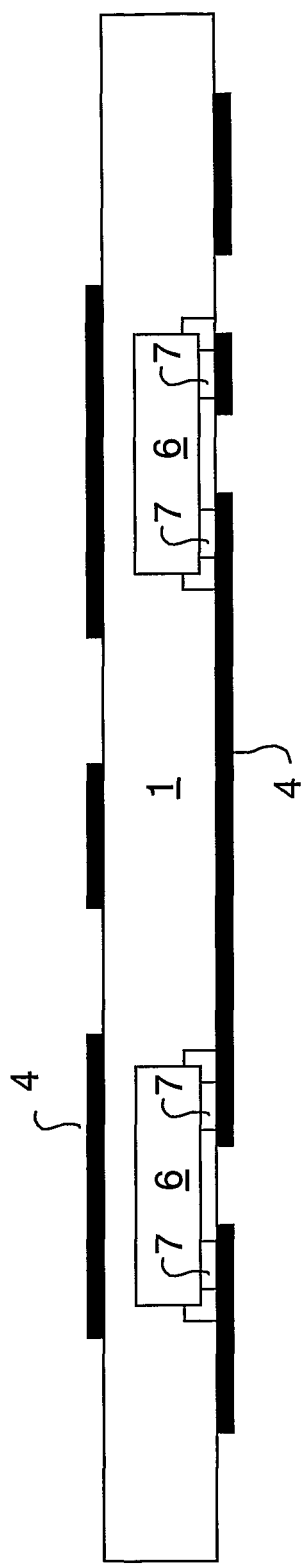
FIG. 8 shows the piece of FIG. 7, after removal of the resist and the seed layer.

After the manufacture of the conductor patterns 4, the resist layers 3 can be removed. In addition the seed layers 2 are removed, for example, by etching (FIG. 8). After this, the circuit-board product may already be finished, but more usually manufacture is continued by making additional alternating insulator layer and conductor-pattern layers on the surfaces of the circuit board, as well as vias, which connect the conductor-pattern layers to each other.

Figure 9:
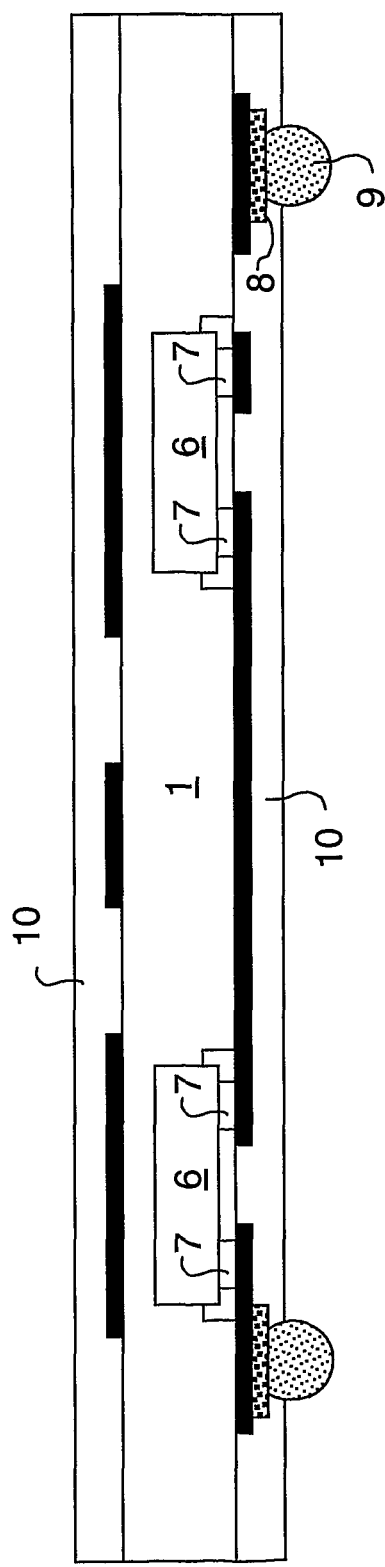
FIG. 9 shows one possible end product.

In the example of FIG. 9, manufacture is continued by making insulator layers 10 on the surfaces of the blank shown in FIG. 8, as well as the external contact elements of the module. The external contact elements include bases 8 made on top of the conductor patterns, as well as contact balls 9 made on their surfaces.

Figure 10:
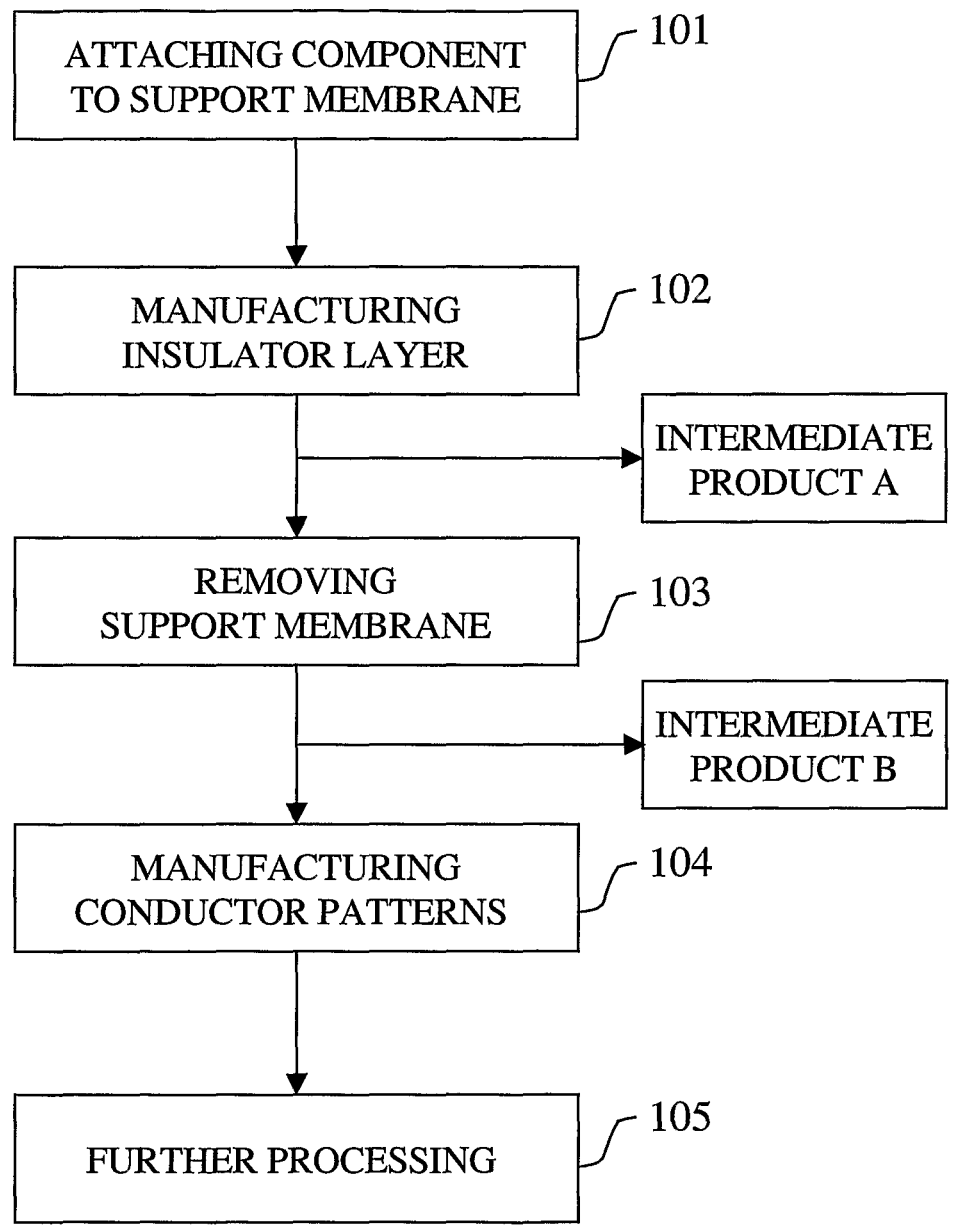
FIG. 10 shows a process diagram, which illustrates some possible embodiments of the invention.

The method described above and possible variations of it are also illustrated in FIG. 10. According to FIG. 10:

In stage 101, a component is attached to the support membrane. This can be performed using the manner described above with the aid of an adhesive, or without an adhesive by using a support membrane possessing a suitable adhesive capability.

In stage 102, the insulator layer is manufactured. This can be performed, for example, as described above.

In stage 103, a suitable method is used to remove the support membrane. The removal can take place, for example, mechanically or chemically or by combining a mechanical and a chemical method. If necessary, an additional stage of the method is performed in order to open the contact elements of the component.

In stage 104, the conductor patterns are made and an electrical contact is formed to the attachment elements of the components. The manufacture of the conductor pattern can be performed, for example, using methods described above, or by some other suitable conductor-pattern manufacturing method. If necessary, at the start of the stage an additional stage of the method is performed to open the contact elements of the component, or to clean the surface of the contact elements.

In the optional stage 105, further processing of the circuit board takes place, for example, the manufacture of additional layers, the manufacture and/or protection of the contact parts.

As can be seen from FIG. 19, it is most suitable to take the intermediate product between stages 102 and 103 (intermediate product A), or between stages 103 and 104 (intermediate product B). Processing is then correspondingly continued on another manufacturing line, or in another factory from stage 103 (intermediate product A) or from stage 104 (intermediate product B).

Figure 11A:
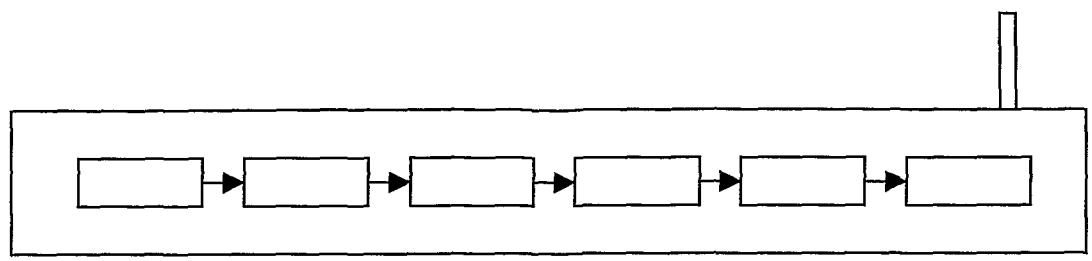
FIG. 11 shows the division of manufacture between production plants and production lines, as well as alternatively concentration in a single production line.
Figure 11B:
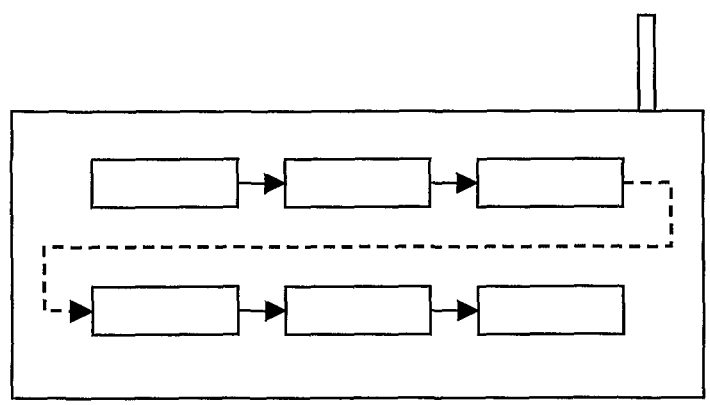
Figure 11C:
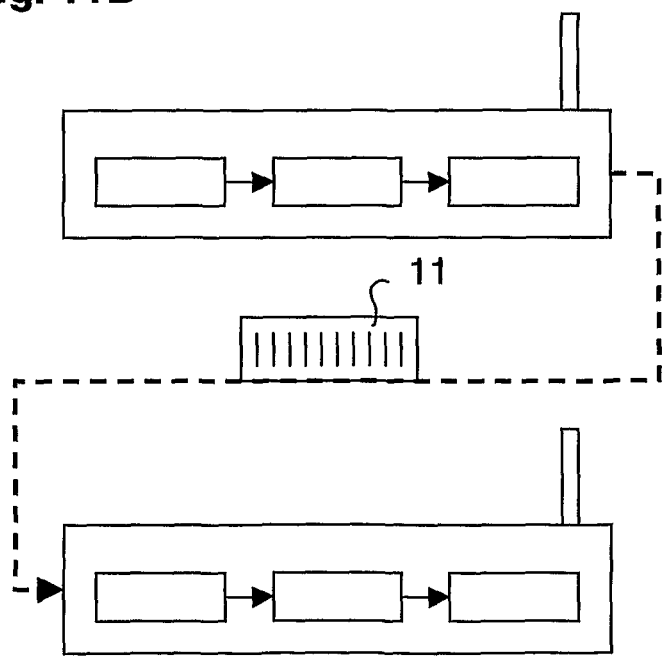

FIGS. 11A, 11B, and 11C illustrate the idea of dividing the manufacturing lines.

FIG. 11A shows an alternative, in which the manufacturing method is implemented entirely in a single production plant and with the aid of a unified manufacturing line. In that case, the intermediate product does not actually have to be taken from the process, but instead manufacture continues up until an essentially finished circuit board or electronic module. This solution is very suitable, for example, for a situation in which it is desired to construct and entirely hew production plant or production line, for the manufacture of highly developed electronic modules.

FIG. 11B shows a situation, in which two separate manufacturing lines are used in the same production plant. On the first line, method stages 101-102, or 101-103 are performed, while on the second line the process continues correspondingly with stage 103 or 104. This form of implementation can very well be considered, for example, in a case in which there is an existing circuit-board manufacturing line with sufficient performance in the production plant and it is wished to expand the production capacity of the production plant to highly developed electronic modules, which contain embedded active components. In that case, a new manufacturing line can be built in the production plant, by means of which intermediate products A or B (stages 101-102, or 101-103) are manufactured and then transferred to a circuit-board manufacturing line for further processing. In this case, there is often no need to package the intermediate products in a delivery package.

FIG. 11C shows a situation, in which the method stages are divided to be performed in two separate production plants. In the first production plant, the intermediate products A or B (stages 101-102, or 101-103) are manufactured and transferred to the second production plant for further processing. This form of implementation is competitive, for example, when it is wished to produce highly developed electronic modules in a production plant with a high-performance circuit-board manufacturing line, without additional investments for a component assembly line. In that case, the intermediate products A or B can be ordered from another production plant, which manufactures intermediate products and in which they are packed in a delivery package 11 for transporting the intermediate products. In this way, in even a production plant with a high-performance circuit-board manufacturing line, it is possible to manufacture, for example, the products described in publication WO 2004/089048.

In the embodiment shown in the figures, the contact elements 7 of the component 6 protrude outwards from the level of the surface of the component. As will have already become apparent from the preceding description, it is, however, also possible in the method to use components 6, in which the free contact surfaces of the contact elements 7 are essentially on the level of the corresponding surface of the component, i.e. of the attachment surface. In that case, the component 6 is also preferably pressed against the support membrane 12. When using an adhesive 5 and relatively hard support membrane 12, the pressing preferably takes place in such a way that practically no adhesive remains between the component 6 and the support membrane 12. In an attachment implemented without an adhesive, the component 6 is of course naturally pressed against the support membrane 12. Components 6, the passivation and protection layer of the surface of which is sufficient to permit a conductor pattern to be made directly on the surface of such a passivation and protection layer, are particularly well suited to such a method.

The examples presented above describe some possible processes, with the aid of which our invention can be exploited. However, our invention is not restricted to only the first and second embodiment described above, but instead the invention encompasses other different processes and their end products too, in the full scope of the Claims and taking equivalence interpretation into account. The invention is also not restricted to only the constructions and methods depicted in the examples, but instead it will be obvious to one skilled in the art that various applications of the invention can be used to manufacture very many different kind of electronic module and circuit board, which differ even greatly from the examples presented above. The components and circuits of the figures are thus shown only with the intention to illustrate the manufacturing process. Thus very many alterations can be made to the processes of the examples shown above, while nevertheless not deviating from the basic idea according to the invention. The alterations can relate, for example, to the manufacturing techniques described in the various stages, or to the mutual sequence of the process stages.

One possible variation that can be mentioned is that it is possible to add to the support membrane 12 a thin insulator membrane, of a thickness of, for example, 1-20 micrometres. With the aid of such an insulator membrane, the attachment of the conductor material, for example copper, in the vicinity of the component can be improved, because the adhesion of the conductor material is not necessarily good on the actual surface of the component, which is, for example, of silicon. The insulator membrane can also help to control the deformations that arise between the component and the conductor pattern due to the effect of, for example, temperature variations.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A method for manufacturing a circuit board from an intermediate product having an insulator layer and at least one component at least substantially inside the insulator layer, the at least one component comprising semiconductor material and contact elements in electrical contact with the semiconductor material, the intermediate product comprising a support membrane covering the contact, the method comprising:
removing the support membrane and revealing the contact elements facing towards the support membrane,
individually cleaning the surfaces of the contact elements by means of a laser for the creation of electrical contacts,
manufacturing a conductor-pattern layer on the surface of the insulator by growing the conductor-pattern layer directly in a correct shape by a growing method, in such a way that the conducting material of the conductor-pattern layer connects electrically to the contact elements of the component and the conductor-pattern layer has the correct shape,
simultaneously, with the manufacturing of the conductor-pattern layer, manufacturing a second conductor-pattern layer on the opposite side of the insulator layer, and
continuing manufacturing of the circuit board by making a number of alternating insulator layers and conductor-pattern layers on top of the conductor-pattern layers.

2. The method of claim 1, wherein the manufacturing of the conductor-pattern layer directly in its correct shape comprises:
growing a thin seed layer of metal on both surfaces of the insulating-material layer,
spreading resist layers on the surfaces of the seed layers,
patterning the resist layers to form conductor-pattern masks,
growing a conductor material electrolytically in the areas from which the resist was removed,
removing the resist layers, and
removing the seed layers.

3. A method for manufacturing a circuit board from an intermediate product having an insulator layer and at least one component at least substantially inside the insulator layer, the at least one component having contact elements that are revealed substantially on the level of the surface of the insulator layer, the at least one component further comprising semiconductor material in electrical contact with the contact elements, the method comprising:
taking the intermediate product, in which the contact elements are revealed,
individually cleaning the surfaces of the contact elements by means of a laser for the creation of electrical contacts,
manufacturing a conductor-pattern layer on the surface of the insulator by growing the conductor-pattern layer directly in a correct shape by a growing method, in such a way that the conducting material of the conductor-pattern layer connects electrically to the contact elements of the component and the conductor-pattern layer has the correct shape,
simultaneously, with the manufacturing of the conductor-pattern layer, manufacturing a second conductor-pattern layer on the opposite side of the insulator layer, and
continuing manufacturing of the circuit board by making a number of alternating insulator layers and conductor-pattern layers on top of the conductor-pattern layers.

4. The method of claim 3, wherein the manufacturing of the conductor-pattern layer directly in its correct shape comprises:
growing a thin seed layer of metal on both surfaces of the insulating-material layer,
spreading resist layers on the surfaces of the seed layers,
patterning the resist layers to form conductor-pattern masks,
growing a conductor material electrolytically in the areas from which the resist was removed,
removing the resist layers, and
removing the seed layers.

5. A method for manufacturing a circuit board, the circuit board containing at least one conductor-pattern layer and at least one component electrically connected thereto, which is located at least substantially inside the insulator layer of the circuit board, the at least one component comprising semiconductor material and contact elements in electrical contact with the semiconductor material, the method comprising:
taking a support,
attaching the at least one component to the support,
manufacturing the insulator layer on the surface of the support, around each attached component,
removing the support and revealing the contact elements of the component,
individually cleaning the surfaces of the contact elements by means of a laser for the creation of electrical contacts,
manufacturing a conductor-pattern layer on the surface of the insulator by growing the conductor-pattern layer directly in a correct shape by a growing method, in such a way that the conductor material of the conductor-pattern layer connects electrically to the contact elements of the component and the conductor-pattern layer has the correct shape,
simultaneously, with the manufacturing of the conductor-pattern layer, manufacturing a second conductor-pattern layer on the opposite side of the insulator layer, and
continuing manufacturing of the circuit board by making a number of alternating insulator layers and conductor-pattern layers on top of the conductor-pattern layers.

6. The method of claim 5, wherein manufacturing of the conductor-pattern layer directly in its correct shape comprises
growing a thin seed layer of metal on both surfaces of the insulating-material layer,
spreading resist layers on the surfaces of the seed layers,
patterning the resist layers to form conductor-pattern masks,
growing a conductor material electrolytically in the areas from which the resist was removed,
removing the resist layers, and
removing the seed layers.

7. The method of claim 5, wherein the support is a support membrane.

8. The method of claim 5, wherein the support is a support surface.

* * * * *